United States Patent [19]

Kim

[11] Patent Number: 5,309,052
[45] Date of Patent: May 3, 1994

[54] CIRCUIT FOR SHIELDING ELECTRO-MAGNETIC WAVE NOISE RADIATED AND CONDUCTED FROM WIPER MOTOR

[75] Inventor: Kwi-Ju Kim, Kwangju, Rep. of Korea

[73] Assignee: Asia Motors Co., Inc., Seoul, Rep. of Korea

[21] Appl. No.: 65,340

[22] Filed: May 21, 1993

[30] Foreign Application Priority Data

Jun. 8, 1992 [KR] Rep. of Korea ............... 1992-9901

[51] Int. Cl.$^5$ ............... H02K 5/24; H05K 9/00
[52] U.S. Cl. ............... 310/51; 174/35 R; 361/818
[58] Field of Search ............... 310/51, 40 MM; 174/35 R, 35 MS; 361/424; 219/10.55 R, 10.55 D; 181/198, 200, 202

[56] References Cited

U.S. PATENT DOCUMENTS

| | | | |
|---|---|---|---|
| 4,741,041 | 4/1988 | Hayashi | 381/122 |
| 4,829,432 | 5/1989 | Hersberger et al. | 361/424 |
| 5,091,823 | 2/1992 | Kanbara et al. | 174/35 R |
| 5,227,581 | 7/1993 | Riviere et al. | 361/424 |

*Primary Examiner*—Steven L. Stephan
*Assistant Examiner*—Matthew Nguyen
*Attorney, Agent, or Firm*—Lowe, Price, LeBlanc & Becker

[57] ABSTRACT

A circuit for shielding an electro-magnetic wave noise radiated and conducted from a wiper motor is disclosed. The circuit absorbs, shields or suppresses such electro-magnetic wave noise when the wiper motor is activated to drive the wiper under a particular weather condition such as rain or snow. The different components of the electro-magnetic wave noise are absorbed or suppressed by different circuit components, so that the electro-magnetic noise could not reach safety devices of the automobile. Therefore accidents can be prevented, and riders can be protected.

2 Claims, 2 Drawing Sheets

CIRCUIT FOR SHIELDING ELECTRO-MAGNETIC WAVE NOISE RADIATED AND CONDUCTED FROM WIPER MOTOR

FIELD OF THE INVENTION

The present invention relates to a circuit for shielding electro-magnetic wave noise radiated and conducted from a wiper motor, in which the parts of the automobile are prevented from malfunctions caused by the electro-magnetic wave noise of the wiper motor, and in which, in the case where safety devices of the automobile are electronically driven, the safety devices are protected from the interference of the electro-magnetic wave noise of the wiper motor to prevent malfunctions of the safety devices, thereby preventing accidents and saving human lives.

BACKGROUND OF THE INVENTION

Generally, under particular weather conditions such as rain or snow, if an activation switch for a wiper is turned on, then a wiper motor is driven, and the wiper is activated. Under this condition, the electro-magnetic wave noise which is radiated or conducted from the wiper motor can adversely effect an anti-lock brake system or an electronically driven automatic speed shifting device. In such a case, the system or the device can malfunction, or became disabled with the possible result that an accident may occur. That is, as the wiper is activated during a particular condition of weather such as rain or snow, the electro-magnetic wave noise can cause an automobile disorder or a serious accident, resulting in economic loss and the sacrifice of human lives.

SUMMARY OF THE INVENTION

The present invention is intended to overcome the above described disadvantages of the conventional device.

Therefore it is object of the present invention to provide a circuit for shielding the electro-magnetic wave noise of a wiper motor, in which the electro-magnetic wave noise of the wiper motor is shielded and absorbed to convert it to energy and to guide the energy to the automobile body, thereby preventing the adverse influence to the parts of the automobile.

In achieving the above object, the present invention is characterized in that: first the electro-magnetic noise which can cause an accident is absorbed and shielded within the wiper motor assembly to convert the wave noise to a thermal energy and to direct it to the metallic automobile body; the electro-magnetic wave noise which escapes the motor assembly is further shielded and absorbed to convert it to a thermal energy and to direct the thermal energy to the metallic automobile body; and a wire which extends from a shielding case consists of a wire filter up to the wiper driving switch terminal, thereby shielding and absorbing the residue noise.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
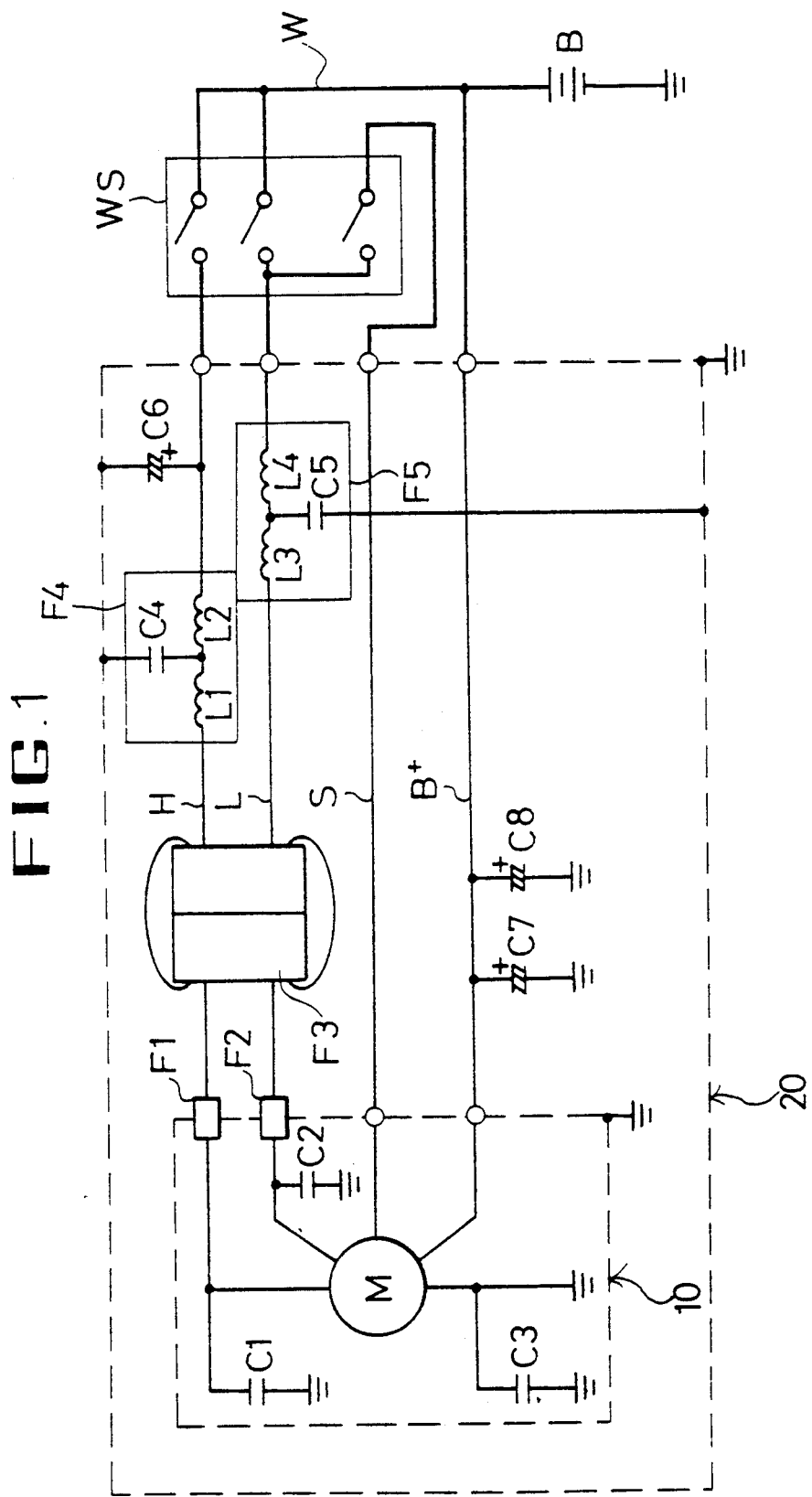
FIG. 1 illustrates the circuit of the present invention.

The device for shielding the electro-magnetic wave noise according to the present invention includes: a wiper motor case 10 grounded to the automobile body, and for shielding and absorbing the electro-magnetic wave noise for the first time after the electro-magnetic wave noise is generated from the wiper motor M, a hole for drawing a conductive wire from wiper motor M being designed to be minimum in its size, and the residue space of the hole after drawing the conductive wire being sealed with a noise absorbing material such as a ferrite sealing bond or an elastomer sealing gasket; a shielding case 20 grounded to the automobile body through a large portion, and for shielding and absorbing the electro-magnetic wave noise for the second time after the electro-magnetic wave noise has escaped through the wiper motor case 10, the residue space of a wire drawing hole being sealed with a noise absorbing material such as a ferrite sealing bond or an elastomer sealing gasket; a copper core wire 30 for damping the electro-magnetic wave noise; and a wire filter W consisting of incombustible teflon cladding materials 40 and 40' and a noise absorbing material 50, and connected to the respective conductive wires drawn from the shielding case 20.

The wiper motor case 10 which shields and absorbs the electro-magnetic wave noise for the first time is connected to respective brushes to absorb the conducting electro-magnetic wave noise. The case 10 further includes: a plurality of ceramic capacitors C1–C3 for converting a high frequency band noise to a thermal energy; and ferrite beads F1 and F2 for shielding a part of the electro-magnetic wave noise to convert it to a thermal energy.

The shielding case 20 which shields and absorbs the electro-magnetic wave noise for the second time includes: a plurality of ferrite cores F3 consisting of a plurality of windings of wires for absorbing and suppressing the electro-magnetic wave noise of a wide band propagating through the conductive wires from the motor case 10; noise filters F4 and F5 consisting of inductive components L1–L4 and conductive components C4 and C5 for absorbing and suppressing the electro-magnetic noise of a high frequency band; and electrolytic capacitors C6–C8 connected to the noise filter F4 of a high speed line H in parallel, and also connected to a bias line B', for absorbing the electro-magnetic wave noise of a low frequency band to convert it to a thermal energy.

The circuit of the present invention constituted as above will now be described as to its action and effect.

If a driving switch WS is turned on to drive the wiper motor at a low or high speed, the power of a battery B is supplied to drive the wiper motor M. Then there are radiated various electro-magnetic wave noises such as: a glow discharge noise due to the transitional current between the rotor and the brush of the wiper motor M; a noise due to the contact resistance between the brush and the rotor; a noise due to the pressure difference in the brush; and a noise due to the wearing of the contacts between the brush and the rotor.

The various components of the electro-magnetic wave noise are damped for the first time by the motor case 10, and the ceramic capacitors C1-C3 which are connected to the respective brushes absorb the electro-magnetic wave noise of the microwave band (over 10 MHz) to convert it to a thermal energy. Meanwhile, the electro-magnetic wave noise which is bypassed through the high speed line H or a low speed line L are shielded or dissipated by the ferrite beads F1 and F2. Further, the electro-magnetic wave noise which is radiated from the wiper motor M is shielded and absorbed by the motor case 10 to be passed to the ground. The drawing hole for drawing the wire from the motor case 10 is made to be minimum in its size, while the residue space after drawing the wire is sealed with a noise absorbing material such as a ferrite sealing bond or an elastomer sealing gasket.

The high speed line H or the low speed line L which are drawn from the motor case 10 are wound around the ferrite core F3 many times, thereby suppressing the electro-magnetic noise of a wide band (15 KHz–30 MHz). Under this condition, the high speed line H and the low speed line L which pass through the ferrite core F3 damp and suppress the electro-magnetic wave noise of the microwave band (10 MHz and over) by means of the inductive components L1-L4 and the conductive components C4 and C5. The bias line B+ which is connected to the next of the noise filter F4 of the high speed line H is connected to the electrolytic capacitors C6-C8 of the shielding case 20, and then, is grounded, so that impulse type rectangular noise of below the low frequency band (1 KHz or less) should be removed.

Figure 2:
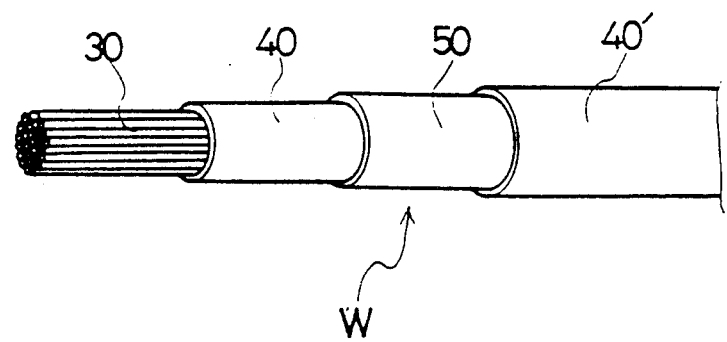
FIG. 2 illustrates the constitution of the wire filter according to the present invention. Description of the preferred embodiment

The drawing holes for drawing the high speed line H, the low speed line L, a stop line S and the bias line B+ from the shielding case 20 are designed to be minimum in size. The residue space in the drawing hole of the case is sealed with a noise absorbing material such as a ferrite sealing bond or a elastomer sealing gasket, while the grounding portion is made to be as large as possible. The line which extends from the shielding case 20 through the wiper driving switch WS to the battery power source B is made to consist of a wire filter line W. As shown in FIG. 2, the wire filter line W includes: a plurality of conductive core wires 30; an incombustible cladding material 40 surrounding the core wires 30; a noise absorbing member 50 surrounding the cladding material 40; and a incombustible cladding material 40' surrounding the noise absorbing member 50.

The wire filter line W also shields and absorbs the electro-magnetic wave noise of a low frequency band (1 KHz or less), and gives a noise filtering effect through the inductive and conductive components.

According to the present invention, the electro-magnetic wave noise which is radiated and conducted from the wiper motor M is thoroughly damped and suppressed, so that possible accident can be prevented, thereby saving human lives and avoiding economic loss.

What is claimed is:

1. A circuit for shielding an electro-magnetic wave noise radiated from or conducted by a wiper motor (M), comprising:

a wiper motor case (10) for shielding and absorbing electro-magnetic wave noise radiated and conducted from said wiper motor (M) therein, said motor case (10) being grounded, a first wire drawing hole in said motor case for drawing conductive wires from said wiper motor (M), a residue space of said first wire drawing hole after drawing said wires being sealed with a noise absorbing material such as a ferrite sealing bond or an elastomer sealing gasket;

a shielding case (20) for shielding and absorbing electro-magnetic wave noise radiated and conducted from said wiper motor case (10), a second wire drawing hole in said shielding case, a residue space of said second wire drawing hole being sealed with a noise absorbing material such as a ferrite sealing bond or an elastomer sealing gasket; and a wire filter wire (W) including a set of copper core wires (30) for damping the conducting electro-magnetic wave noise and connected to the respective conductive wires drawn from said shielding case (2), and incombustible Teflon cladding materials (40 and 40') and an noise absorbing member (50) surrounding said core wires (30), wherein said wiper motor case (10) which shields and absorbs the electro-magnetic wave noise includes:

a plurality of ceramic capacitors (C1-C3) connected to respective brushes of said wiper motor for absorbing for the first time the conducted electro-magnetic noise of the microwave band to convert the noise to a thermal energy;

and ferrite beads (F1 and F2) for shielding a part of the conducted electro-magnetic wave noise to convert it to a thermal energy.

2. A circuit for shielding an electro-magnetic wave noise radiated from or conducted by a wiper motor (M), comprising:

a wiper motor case (10) for shielding and absorbing electro-magnetic wave noise radiated and conducted from said wiper motor (M) therein, said motor case (10) being grounded, a first wire drawing hole in said motor case for drawing conductive wires from said wiper motor (M), a residue space of said first wire drawing hole after drawing said wires being sealed with a noise absorbing material such as a ferrite sealing bond or an elastomer sealing gasket;

a shielding case (20) for shielding and absorbing electro-magnetic wave noise radiated and conducted from said wiper motor case (10), a second wire drawing hole in said shielding case, a residue space of said second wire drawing hole being sealed with a noise absorbing material such as a ferrite sealing bond or an elastomer sealing gasket; and a wire filter line (W) including a set of copper core wires (30) for damping the conducting electro-magnetic wave noise and connected to the respective conductive wires drawn from said shielding case (2), and incombustible Teflon cladding materials (40 and 40') and a noise absorbing member (50) surrounding said core wires (30), wherein said shielding case (20) which shields and absorbs the electro-magnetic wave noise includes:

a plurality of ferrite cores (F3) drawn out from said motor case (10), with said conductive wires wound thereon many times for absorbing and suppressing the electro-magnetic wave noise of a wide band conducted through said conductive wires;

noise filters consisting of inductive components (L1-L4) and conductive components (C4 and C5) for absorbing and suppressing the electro-magnetic wave noise of the microwave band; and a plurality of electrolytic capacitors (C6-C8) connected to one of said noise filters (F4) of a high speed line (H) in parallel, and also connected to a bias line B+, and for absorbing the electro-magnetic wave noise of a low band to convert it to a thermal energy, said high speed and bias lines (H and B+) being in said conductive wires.

* * * * *